US006493866B1

(12) United States Patent
Mayhew

(10) Patent No.: US 6,493,866 B1
(45) Date of Patent: Dec. 10, 2002

(54) PHASE-SHIFT LITHOGRAPHY MAPPING AND APPARATUS

(75) Inventor: Jeffrey P. Mayhew, Portland, OR (US)

(73) Assignee: Synopsys, Inc., Mountain View, CA (US)

(*) Notice: Subject to any disclaimer, the term of this patent is extended or adjusted under 35 U.S.C. 154(b) by 233 days.

(21) Appl. No.: 09/608,498

(22) Filed: Jun. 30, 2000

(51) Int. Cl.[7] .............................. G06F 17/50; G03C 5/04

(52) U.S. Cl. ................................ 716/21; 716/4; 716/19; 430/5; 430/396

(58) Field of Search ............................ 716/4, 5, 19, 20, 716/21; 430/5, 4, 394, 395, 396

(56) References Cited

U.S. PATENT DOCUMENTS

| | | | |
|---|---|---|---|
| 5,308,741 A | 5/1994 | Kemp | 430/312 |
| 5,342,713 A | 8/1994 | Ohtsuka et al. | 430/5 |
| 5,523,186 A | 6/1996 | Lin et al. | 430/5 |
| 5,537,648 A | 7/1996 | Liebmann et al. | 395/500 |
| 5,538,833 A | 7/1996 | Ferguson et al. | 430/325 |
| 5,573,890 A | 11/1996 | Spence | 430/311 |
| 5,636,131 A | 6/1997 | Liebmann et al. | 364/490 |
| 5,672,450 A | 9/1997 | Rolfson | 430/5 |
| 5,686,208 A | 11/1997 | Le et al. | 430/5 |
| 5,858,580 A | 1/1999 | Wang et al. | 430/5 |
| 5,883,813 A | 3/1999 | Kim et al. | 364/491 |
| 5,923,562 A | 7/1999 | Liebmann et al. | 364/488 |
| 5,923,566 A | 7/1999 | Galan et al. | 364/489 |
| 6,057,063 A | * 5/2000 | Liebmann et al. | 430/5 |
| 6,185,727 B1 | * 2/2001 | Liebmann | 430/394 |

OTHER PUBLICATIONS

Levenson et al., "Improving Resolution in Photolithography with a Phase–Shifting Mask", IEEE Transactions on Electron Devices, vol. ED–29, No. 12, Dec. 1982, pp. 1828–1836.

Gerald Galan et al., "Application of Alternating–Type Phase Shift Mask to Polysilicon Level for Random Logic Circuits", *Japanese Journal of Appied Physics* vol. 33 (Dec. 1994), Part 1, No. 12B, pp. 6779–6784.

Tamae Haruki et al., "Algorithm for shifter placement with flexible order prioritizing", *J. Vac. Sci. Technol.* B 15(6), Nov./Dec. 1997, pp. 2394–2398.

F. M. Schellenberg et al., "Real and Imaginary Phase–Shifting Masks", *BACUS News*, vol. 8, Issue 12, Dec. 1992, pp. 1, 4–11.

(List continued on next page.)

*Primary Examiner*—Matthew Smith
*Assistant Examiner*—Leigh Marie Garbowski
(74) *Attorney, Agent, or Firm*—Silicon Valley Patent Group LLP; Omkar Suryadevara

(57) ABSTRACT

For phase-shifting microlithography, a method of assigning phase to a set of shifter polygons in a mask layer separated by a set of target features includes assigning a first phase to a first shifter polygon, identifying a set of target features that touch the first shifter polygon, and assigning a second phase to all shifter polygons in the set that touch the set of target features in contact with the first shifter polygon. The set of shifter polygons and the set of target features are separated into aggregates that are spatially isolated from each other such that the phase assignment in one aggregate does not affect the phase assignments in other aggregates. In one embodiment, the first shifter polygon in each aggregate is selected by merging the set of shifter polygons and set of target features into a large polygon, marking a vertex of the large polygon, checking the vertex to make sure it only touches one shifter polygon, and selecting the single shifter polygon touching the vertex as the first shifter polygon.

14 Claims, 13 Drawing Sheets

Microfiche Appendix Included
(1 Microfiche, 14 Pages)

OTHER PUBLICATIONS

Marc D. Levinson, "Improving Resolution in Photolithography with a Phase–Shifting Mask", *IEEE Transactions On Electron Devices*, vol. ED–29, No. 12, Dec. 1982, pp. 1828–1982.

Akemi Moniwa et al., "Heuristic Method for Phase–Conflict Minimization in Automatic Phase–Shift Mask Design", *Japanese Journal of Applied Physics*, Part 1, vol. 34, No. 12B, pp. 6584–6589. no date.

Kazuko Ooi et al., "Method of Designing Phase–Shifting Masks Utilizing a Compactor", *Japanese Journal of Applied Physics*, vol. 33 (Dec. 1994), Part 1, No. 12B, pp. 6774–6778.

Hisashi Watanabe et al., "2×2 Phase Mask for Arbitrary Pattern Formation", *Japanese Journal of Applied Physics*, vol. 33 (Dec. 1994), Part 1, No. 12B, pp. 6790–6795.

T. Brunner et al., "170 nm gates fabricated by phase–shift mask and top anti–reflector process", *SPIE vol. 1927 Optical/Laser Microlithography VI* (1993), pp. 182–189.

Hua–Yu Liu et al., "Fabrication of 0.1 $\mu$m T–shaped gates by phase–shifting optical lithography", *SPIE vol. 1927 Optical/Laser Microlithography VI* (1993), pp. 42–52.

David M. Newmark et al., "Phase–shifting mask design tool", *SPIE vol. 1604 11$^{th}$ Annual BACUS Symposium on Photomask Technology* (1991), pp. 226–235.

T. A. Brunner, Session 2, Phase–Shift and Oblique–Illumination Methods, "Rim phase–shift mask combined with off–axis illumination: a path to 0.5$\lambda$/NA geometries", *SPIE vol. 1927 Optical/Laser Microlithography VI* (1993), pp. 54–62.

Dong–Ho Cha et al., "Evaluation of phase–edge phase–shifting mask for sub–0.18$\mu$m gate patterns in logic devices", *SPIE The International Society for Optical Engineering*, vol. 3334, pp. 46–54. no date.

Lars W. Liebmann et al., "A Comprehensive Evaluation of Major Phase Shift Mask Technologies for Isolated Gate Structures in Logic Designs", *SPIE* vol. 2197, pp. 612–623. no date.

Y. C. Pati et al., "Phase–shifting masks for microlithography: automated design and mask requirements", *J. Opt. Soc. Am. A*, vol. 11, No. 9, Sep. 1994, pp. 2438–2452.

T. Waas et al., "Automatic Generation of Phase Shift Mask Layouts", *Elsevier Science B.V., Microelectronic Engineering* 23 (1994), pp. 139–142.

Masato Shibuya et al., "Performance of Resolution Enhancement Technique Using Both Multiple Exposure and Nonlinear Resist", *Japanese Journal of Applied Physics* vol. 33 (Dec.1994), Part 1, No. 12B, pp. 6874–6877.

Hideyuki Jinbo et al., "0.2$\mu$m Or Less–i–Line Lithography By Phase–Shifting–Mask Technology", 1990 *IEEE*, pp. 825–828.

Kazuyuki Inokuchi et al, "Sub–Quarter Micron Gate Fabrication Process Using Phase–Shifting Mask for Microwave GaAs Devices", *Extended Abstracts of the 1991 International Conference on Solid State Devices and Materials*, Yokohama, 1991, pp. 92–94.

Hideyuki et al., "Improvement of Phase–Shifter Edge Line Mask Method", *Japanese Journal of applied Physics*, Part 1, vol. 30, No. 11B, Nov., 1991, pp. 2998–3003.

Y. C. Pati et al., "Phase–Shifting Masks: Automated Design and Mask Requirements", *SPIE—The International Society for Optical Engineering*, vol. 2197, pp. 314–327. no date.

Kurt Ronse et al., "Comparison of various phase shift strategies and application to 0.35 $\mu$m ASIC designs", *SPIE—The International Society for Optical Engineering*, vol. 1927, pt. 1 Optical/Laser Microlithography VI (1993), pp. 2–16 vol. 1.

\* cited by examiner

PHASE-SHIFT LITHOGRAPHY MAPPING AND APPARATUS

COPYRIGHT NOTICE

A portion of the disclosure of this patent document contains material which is subject to copyright protection. The copyright owner has no objection to the facsimile reproduction by anyone of the patent document or the patent disclosure, as it appears in the patent and trademark office patent files or records, but otherwise reserves all copyright rights whatsoever.

Microfiche Appendix A, consisting of 1 sheets and 14 frames, is a part of the present disclosure and is incorporated herein by reference in its entirety. Microfiche Appendix A contains descriptions of commands to software tools.

BACKGROUND

In semiconductor manufacture, micro lithography is used in the formation of integrated circuits on a semiconductor wafer. During a lithographic process, a form of radiant energy, such as ultraviolet light, is passed through a photo mask or a reticle and onto the semiconductor wafer. "Light" is not limited to the visible spectrum. The photo mask contains opaque and transparent regions formed in a predetermined pattern. A grating pattern, for example, can be used to define parallel spaced conducting lines on a semiconductor wafer. The ultraviolet light exposes the mask pattern on a layer of resist formed on the wafer. The resist is then developed to remove either the exposed portions of resist for a positive resist or the unexposed portions of resist for a negative resist. The patterned resist can then be used for subsequent semiconductor fabrication processes such as ion implantation or etching.

As microcircuit densities have increased, the size of the features of semiconductor devices has decreased to the sub-micron level. These sub-micron features may include the width and spacing of metal conducting lines or the size of various geometric features of active semiconductor devices. The requirement of sub-micron features in semiconductor manufacture has necessitated the development of improved lithographic processes and systems. One such improved lithographic process is known as phase shift lithography.

Recently, different techniques have been developed in the art for fabricating different types of phase shifting photo masks. One type of phase shifting mask, named after a pioneer researcher in the field, M. D. Levenson, is known in the art as a "Levenson" or "strong" phase shifting mask. This type of mask is also referred to as an "alternating aperture" phase shifting mask because every other aperture contains a phase shifter. The term "strong" refers to the use of non-attenuated or full strength phase shifting illumination.

This type of mask is typically formed on a transparent quartz substrate. An opaque layer, formed of a material such as chromium, is deposited on the quartz substrate and etched with openings in a desired pattern. Phase shifting areas on the mask are formed by depositing a phase shifting material over the opaque layer and into every other opening in the opaque layer. The phase shifting areas may also be formed by etching a pocket or trench in the transparent substrate. The target features for phase shift lithography are the opaque regions. Each opaque target feature is bordered by a transparent, i.e. non phase shifting, opening on one side and a phase shifting opening on the other side. The transparent openings and the phase shifting openings are referred to as shifter polygons.

With phase shift lithography, the interference of light rays is used to improve the resolution and depth of focus of an image projected onto a target. In "strong" phase shift lithography, the phase of an exposure light at the object is controlled such that adjacent bright areas are formed preferably 180 degrees out of phase with one another. Dark regions are thus produced between the bright areas by destructive interference even when diffraction without phase shifting would otherwise cause these areas to be exposed away. This technique improves total resolution at the object and allows resolutions as fine as 0.1 $\mu$m or finer to occur.

In general, a strong phase shifting photo mask is constructed with a repetitive pattern having three distinct layers or areas. An opaque layer provides areas that allow no light transmission. A transparent layer provides areas which allow close to 100% of light to pass through. A phase shift layer provides areas which allow close to 100% of light to pass through but phase shifted 180 degrees from the light passing through the transparent areas. The transparent areas and phase shift areas are situated such that light rays diffracted are canceled out in a darkened area therebetween. This creates the pattern of dark and bright areas which can be used to clearly delineate features of a pattern defined by the opaque layer of the mask on a photopatterned semiconductor wafer.

In order to generate a phase shift lithography mask, target features in a given circuit design, or features that are small enough to require phase shift lithography, are identified. Next, shifter polygons meeting dimensional criteria dictated by mask-making constraints and optical performance are created on either side of each target feature. Then, the shifter polygons are "colored," that is, assigned one of two color designations, so that each target feature is sandwiched between shifter polygons of opposing colors. The two colors correspond to the phase shifted and non phase shifted apertures.

An electronic representation of such a mask can be generated using a design rule check (DRC) tool of a layout verification software tool. Examples of such a layout verification tool include (1) HERCULES software available from Avant! Corporation, 46871 Bayside Parkway, Fremont, Calif. 94538, Tel 510.413.8000, (2) VAMPIRE software available from Cadence Design Systems, Inc, 555 River Oaks Parkway, San Jose, Calif. 95134, Tel 408.943.1234, and (3) CALIBRE software available from Mentor Graphics Corporation, 8005 SW Boeckman Road, Wilsonville, Oreg., 97070, Tel 503.685.7000.

The phase-shift mask is created in the DRC tool by applying several logical (such as not, and, or, and xor) and sizing operations to a representation of the circuit design to form output layers, such as a layer of target features, a layer of shifter polygons that pass light of phase 0°, and a layer of shifter polygons that pass light of phase 180°. The output layers correspond to features created on one or more masks. For simplicity, assigning shifter polygons to a particular output layer is referred to as assigning phase to a polygon or phase mapping a polygon.

In selective phase shift masks, target features are selected by applying a set of dimensional measurements to select only features with a specified width, i.e. smaller than the resolution of conventional optical lithography. The shifter polygons are created by applying sizing and logical operations using the input pattern as a starting point.

Once the shifter polygons are created, one needs to assign phases to the shifter polygons. Assigning phase by hand is burdensome particularly for random logic. Typical computer methods require first sorting the shifter polygons into runs of shifter polygons oriented in the same direction. A "run" refers to a horizontal "run" of shifter polygons separated by target features, such that the run unambiguously alters between a shifter polygon and a target feature. Phase is then assigned by traversing the run in the direction of the run and assigning phase to the shifter polygons by alternating between phase 0 and phase 180. If two shifter polygons are not separated by a target feature, they are not interrelated. Such methods are limited. They work for a run in which the target features extend in the same predetermined direction such that traversing all of the shifter polygons in the run requires moving in only one direction. Such methods also require the data to first be sorted into runs. Sorting therefore adds an extra data processing step. Furthermore, in complex configurations where the target features contain branches or loops, it may not be possible to map the pattern by this technique alone. Therefore, it is desirable to develop more versatile computer methods for phase assignment of shifter polygons in a phase shift lithography mask.

SUMMARY

In accordance with the present disclosure, a method and associated apparatus for assigning phase to a set of shifter polygons separated by a set of target features are provided which do not require first separating the shifter polygons into runs having a well-defined spatial order. Before phase is assigned to the shifter polygons, any shifter polygon configurations that would create a phase mapping paradox are altered, so that the set of shifter polygons to be mapped is unambiguous.

The shifter polygons are then each assigned to an output phase layer. First, a starting shifter polygon is selected and assigned to a first phase layer. In one embodiment, the starting shifter polygon is selected by merging the target features and shifter polygons into a large polygon, marking a vertex on the merged polygon, then selecting a shifter polygon touching that vertex as the starting shifter polygon provided it is the only shifter polygon touching the marked vertex. A first set of target features touching the starting shifter polygon is then identified. A first set of shifter polygons touching the first set of target features is assigned to a second phase layer. A second set of target features touching the first set of shifter polygons is then identified. A second set of shifter polygons touching the second set of target features is assigned to the first phase layer containing the starting shifter polygon. The process continues to identify a set of target features adjacent to the current set of shifter polygons, identify a new set of unassigned shifter polygons, and assign the new set of shifter polygons a phase opposite that of the current set until all the shifter polygons have been assigned.

DETAILED DESCRIPTION

Figure 1:
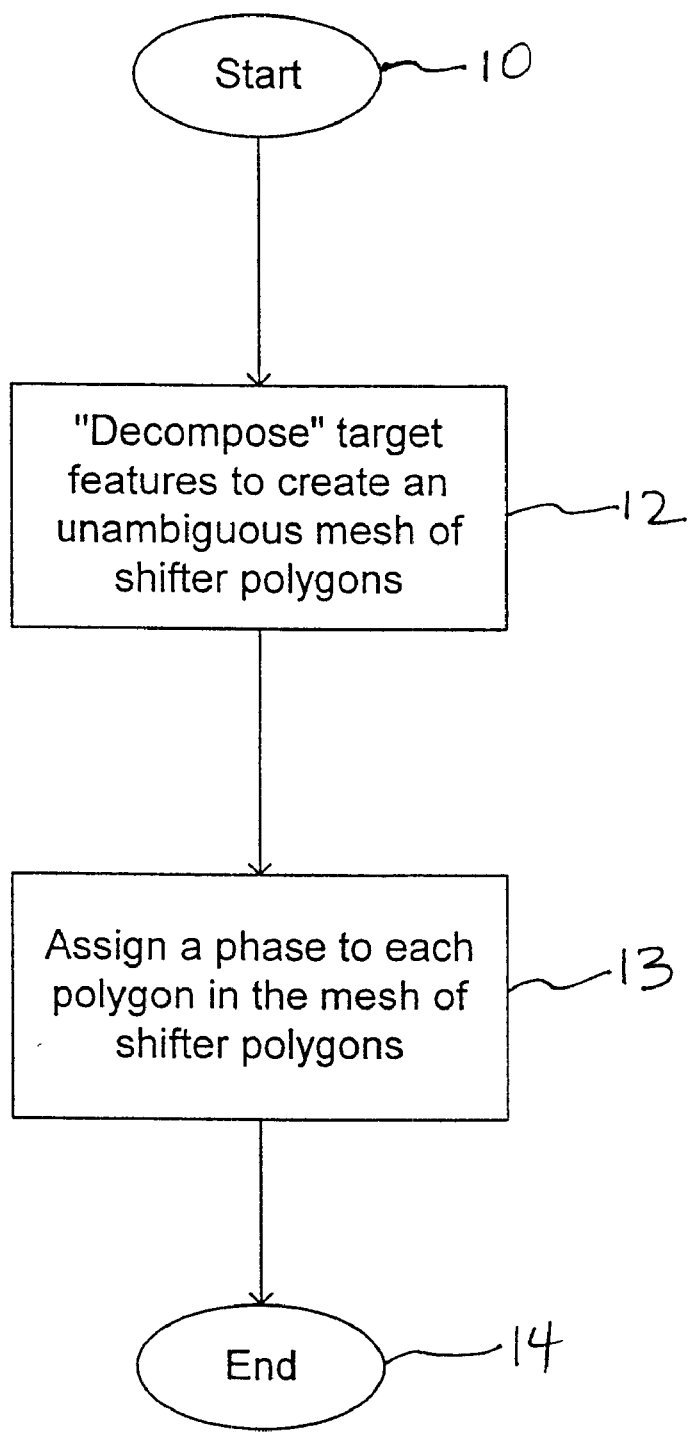
FIG. 1 shows, in a high level flowchart, a method for forming a phase-shift mask from a set of target features and a set of shifter polygons.

FIG. 1 shows, in a high level flowchart, a method for forming a phase-shift mask for lithography. The process starts at stage 10. The data input to the process defines a layer of target features and a layer of shifter polygons (not shown). The target features are also called critical gates, though the target features can be any circuit features created by lithography, not necessarily logic gates or transistors. In stage 12, the target features are decomposed to create an unambiguous mesh of shifter polygons. In stage 13, each shifter polygon in the mesh is assigned a phase. The process ends in stage 14. In one embodiment, the method of FIG. 1 is implemented in a DRC tool.

Most target features are represented as simple line structures without forks or junctions, but occasionally more complex configurations with branches in the target features are required. Decomposition of mask data containing these complex configurations is required prior to assigning phase to the shifter polygons because the proper functioning of the phase-assignment method described below requires that the contact relationships between the polygons reflect the requirement of opposing phase. Thus, decomposition is performed to delete any intersections between branches of target features that create point-touch relationships between target features and shifter polygons.

Figure 2:
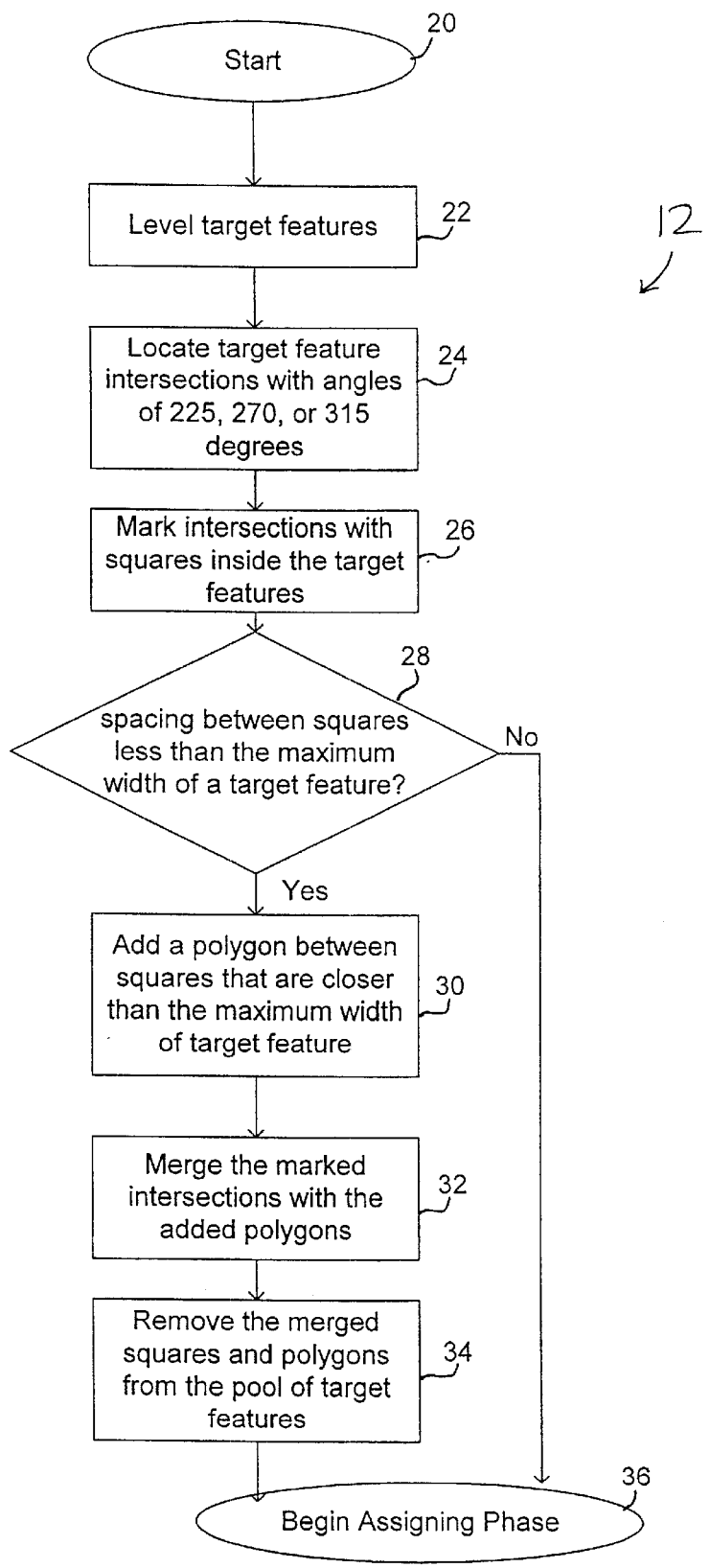
FIG. 2 shows, in a flowchart, one embodiment of a method of decomposing a set of target features to establish unambiguous relationships between the mesh of shifter polygons and the target features.

FIG. 2 shows, in a flowchart, one embodiment in accordance with this disclosure of a method of decomposing a set of target features to form an unambiguous mesh of shifter polygons, shown as stage 12 in FIG. 1. FIGS. 3A–3D show pictorially a circuit design with the target features decomposed in accordance with the method of FIG. 2. The decomposition starts in stage 20 (FIG. 2). In stage 22, the target features in the circuit design are "leveled." Leveling refers to preparing the circuit design data for the decomposition operation. Due to the large size of integrated circuit patterns, the patterns are often represented using a method that minimizes the redundant definition of multiple instances of the same polygons or sets of polygons. The circuit pattern is represented hierarchically, as a tree of multiple references in which each polygon is defined only once. The total pattern definition is created by referring to the placement of each polygon. The placement of each polygon specifies the item to be replicated, the location at which it is to be replicated, and any other transformations to be applied to that placement, such as rotation, change of scale, or reflection. The hierarchy is made of up cells, with the top cells containing the entire pattern and the bottom cells containing only polygon data. A common file format for storing this type of hierarchic data is called GDS. DRC tools distinguish between operations that are performed on the entire hierarchy and operations that are performed at the cell-level only. Cell-level operations can only operate on the polygons in a given cell. Thus, polygons in adjacent cells are ignored, even if the polygons in adjacent cells contact or overlap the polygons in the current cell. Thus, before performing a cell-level operation, the user can "level" the data by incorporating polygons that touch or overlap hierarchically into a common cell. In some embodiments, the data must be leveled because many of the DRC commands used for the decomposition are cell-level commands.

Figure 3A:
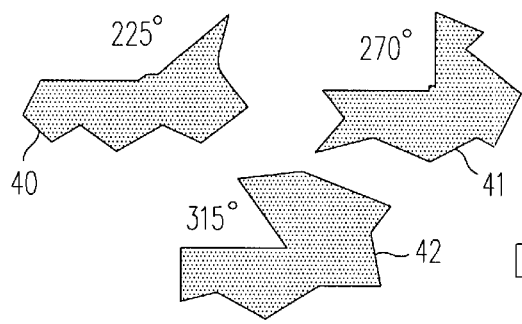
FIGS. 3A–3D show mask designs with the target features decomposed in accordance with the method of FIG. 2.
Figure 3B:
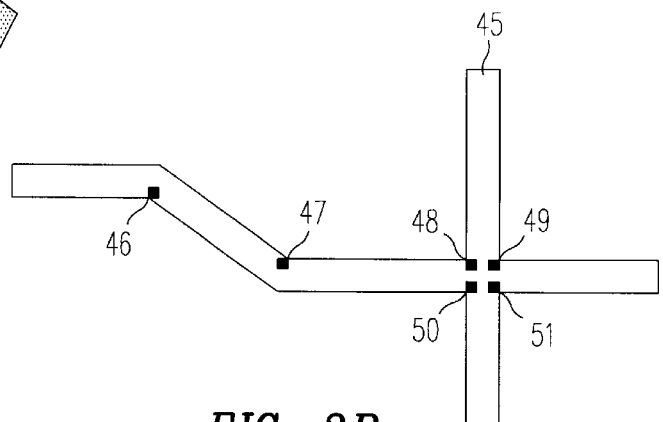
Figure 3C:
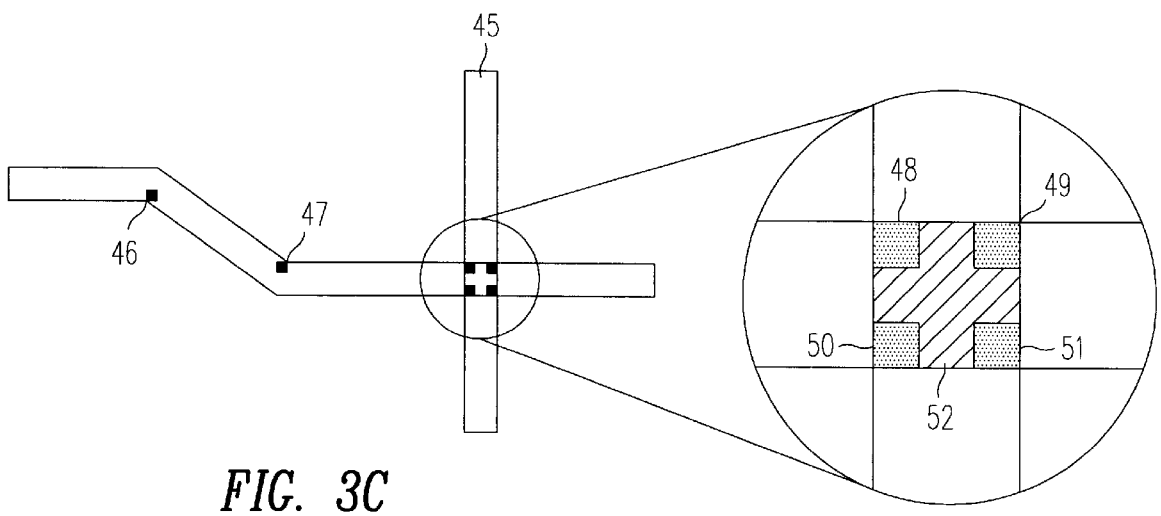

After the target features are leveled in stage 22 (FIG. 2), intersections between different sections of target features which may be problematic, that is, intersections at angles of 225°, 270°, and 315° are located in stage 24. FIG. 3A shows the three types of intersections 40, 41, and 42. In the data layers, these intersections are marked with small squares, or any other shape of marker, placed in the target features at the intersections in stage 26. FIG. 3B shows a target feature 45 after the problematic intersections are marked with squares 48–51 inside the target feature. The distance between the squares is checked in stage 28. If any of the marking squares are closer together than the maximum width of a target feature, that is, a feature small enough that it requires shifter polygons on either side, a polygon is added between the squares in stage 30. FIG. 3C shows a feature intersection with marking squares 48–51 closer together than the maximum width of a target feature. A polygon 52 has been added between squares 48–51.

Figure 3D:
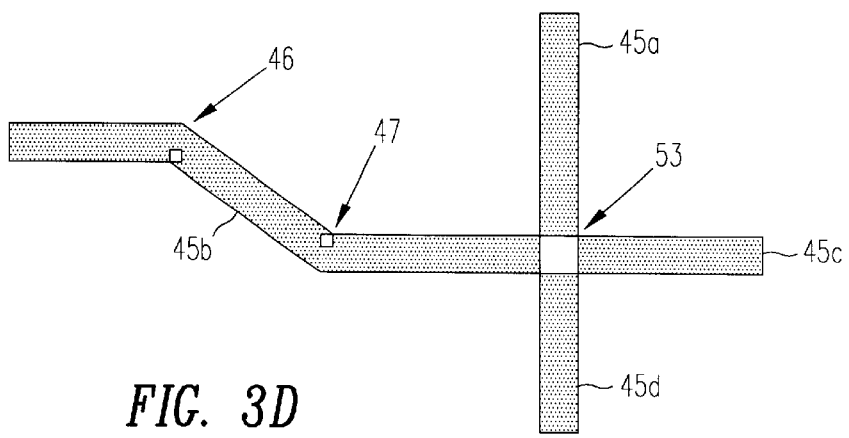

In stage 32, the squares marking the intersections are merged with the polygons added between the squares in stage 30. In stage 34, the merged squares and polygons are subtracted from the pool of target features. FIG. 3D shows the target feature 45 after the squares 48–51 are merged with polygon 52 to form merged polygon 53. Merged polygon 53 is deleted from the target feature 45. Target feature 45 (FIG. 3B) is now decomposed into three target features 45a, 45b, and 45c (FIG. 3D). The intersections marked by squares 46 and 47 have been modified by the placement of the squares, but the sections of target feature 45b on either side of squares 46 and 47 are not severed into separate target features because the distance between squares 46 and 47 and the nearest marking squares is greater than the maximum width of a target feature. The decomposition operation ends in stage 36, and the DRC tool begins assigning phase to the polygons.

The group of shifter polygons and decomposed target features will exhibit aggregates, or groups that are not connected to each other via target features, such that the phase assignments in one group will not affect the phase assignments in another group. Phase assignment is done independently for each group. Thus, the phase assignment for each group may occur in parallel in the DRC tool.

Figure 4:
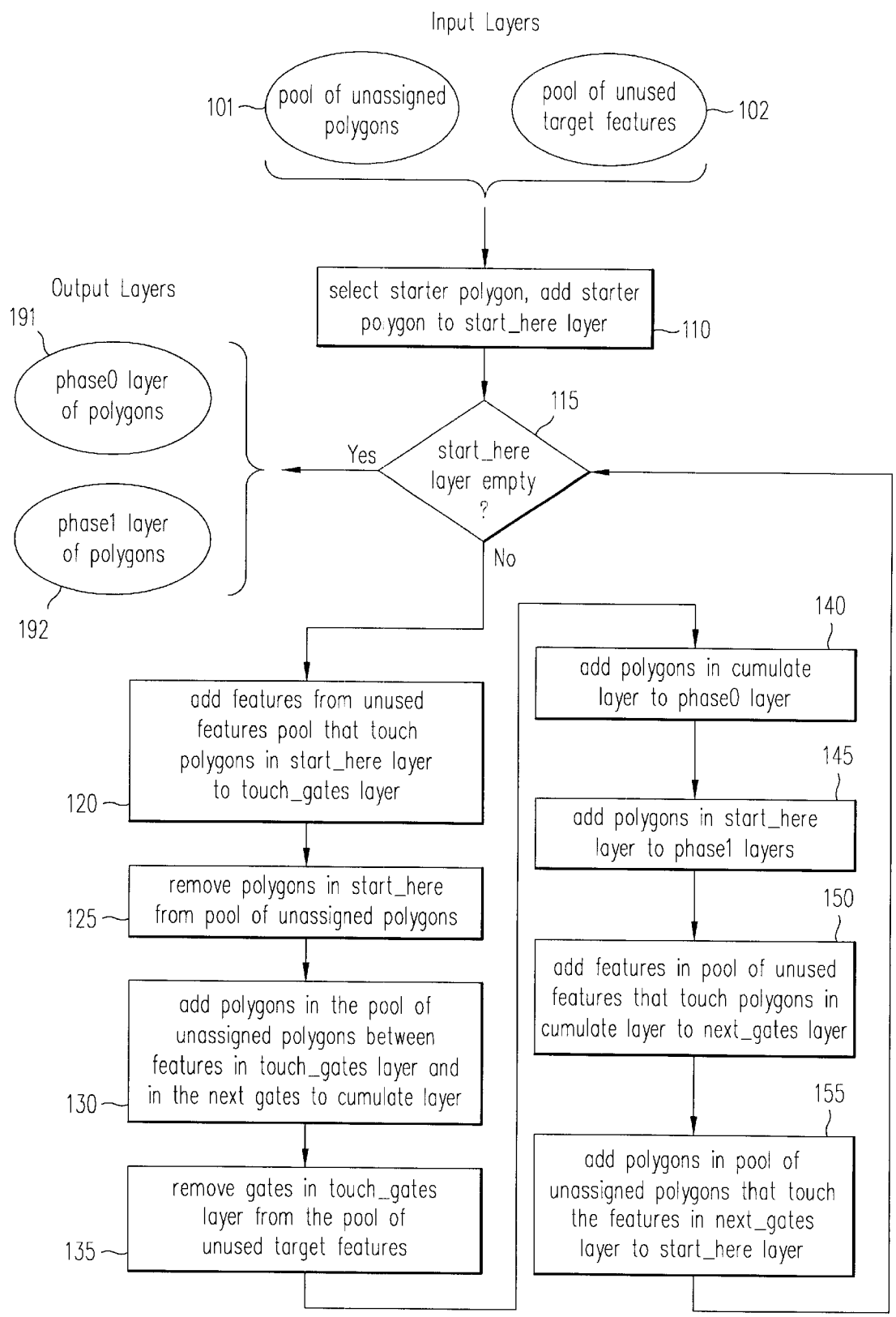
FIG. 4 shows, in a flowchart, one embodiment of a method of assigning phase to a set of shifter polygons.
Figure 5A:
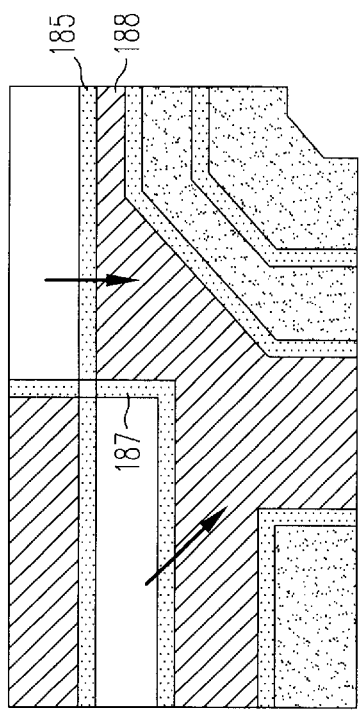
FIGS. 5A–5D show a mask design with the phase assigned to the shifter polygons in accordance with the method of FIG. 4.

FIG. 4 is a detailed flowchart of one embodiment of the method of assigning phase to a set of shifter polygons, shown in stage 13 of FIG. 1. FIGS. 5A–5D show pictorially a part of a circuit design with the phase assigned to the shifter polygons in accordance with the method of FIG. 4. Two derived layers, derived from the circuit design, are input into the DRC tool. Layer 101 is a group of shifter polygons without phase assignments. Layer 102 is a group of target features which the shifter polygons surround. The result of the process is a layer of shifter polygons of a first phase (191), a layer of shifter polygons of a second phase (192), and the layer of target features (not shown in the output, identical to layer 102). In stage 110, a first polygon is selected as the starter polygon. The starter polygon is added to the current layer of shifter polygons, called start_ here in this embodiment. Shifter polygon 180 of FIG. 5A is selected as the starter polygon in stage 110 and moved to layer start_here. The process for selecting the starter polygon is described in more detail in connection with FIG. 7. In stage 115 (FIG. 4), the DRC tool determines if the start_ here layer is empty or if it has unassigned shifter polygons in it. If start_here is not empty, in stage 120 any target features in the pool of unused target features that touch, i.e. that contact any edge of the polygon in the start_here layer, are added to a layer called touch_gates. Target feature 81 and 182 in FIG. 5A are identified the target features in the pool of unused target features that touch shifter polygon 180. Target features 181 and 182 are then added to the touch_ gates layer. In stage 125 of FIG. 4, the polygon in the start_here layer is removed from the pool of unassigned polygons. In stage 130, any polygons in the pool of unassigned polygons that are between the target features in the touch_gates layer and the next set of target features selected are added to a layer called cumulate. Shifter polygons 183 and 184 of FIG. 5A are identified as the polygons in the pool of unassigned polygons that touch target features 181 and 182. Polygons 183 and 184 are then added to the cumulate layer.

Figure 6:
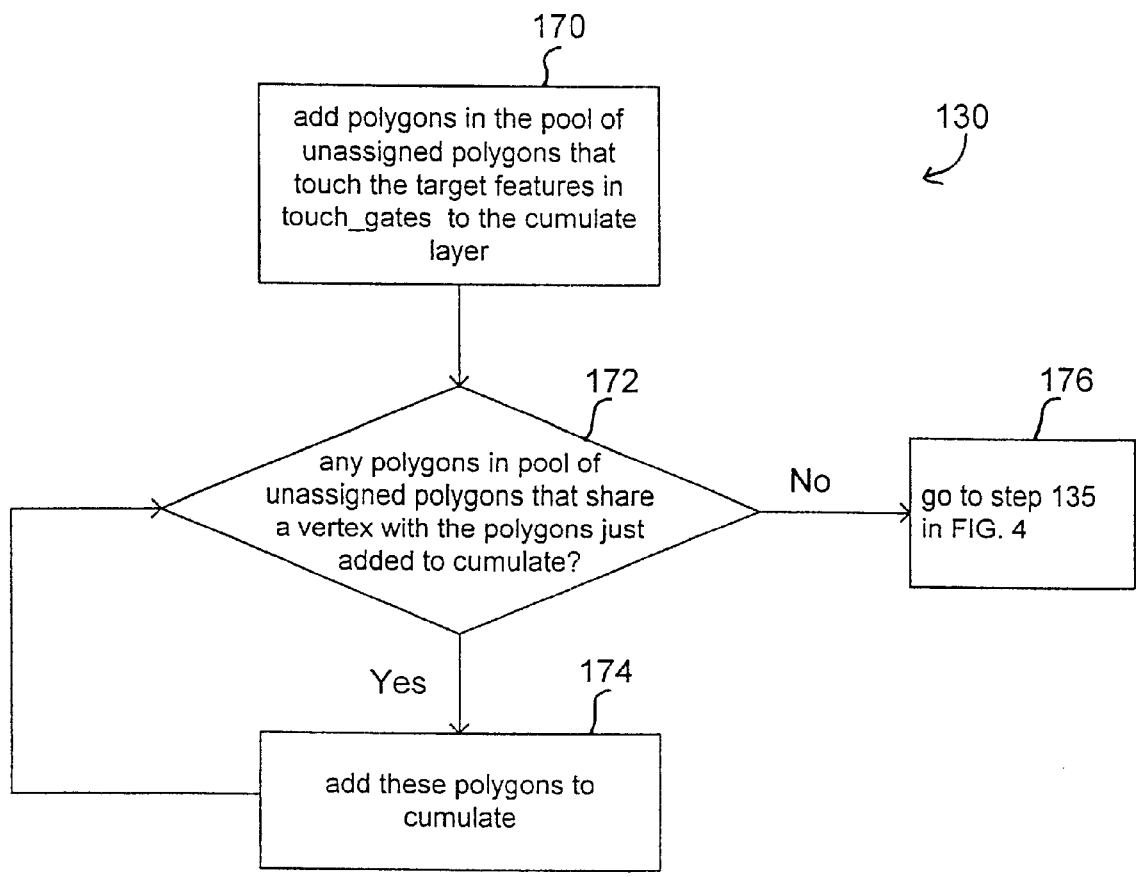
FIG. 6 shows, in a flowchart, one embodiment of a method of identifying the shifters between the current set of target features and the next set of target features.

FIG. 6 illustrates, in a flowchart, stage 130 of FIG. 4 in more detail. In stage 170, the shifter polygons in the pool of unassigned polygons that touch the target features in the touch_gates layer (hereinafter "first polygons") are added to the cumulate layer. In stage 172, the tool checks to see if the first polygons touch or share any vertices with any other polygons in the pool of unassigned polygons (hereinafter "second polygons"). If the first polygons do not touch or share any vertices with any second polygons, the process returns to stage 135 in FIG. 4. If the first polygons do touch or share vertices with second polygons, the second polygons are added to the cumulate layer in stage 174. The tool then returns to stage 172 and checks to see if the second polygons touch or share any vertices with any other polygons in the pool of unassigned polygons. Stages 172 and 174 repeat until the tool cannot find any more polygons that touch or share vertices with the polygons in the cumulate layer.

Figure 5B:
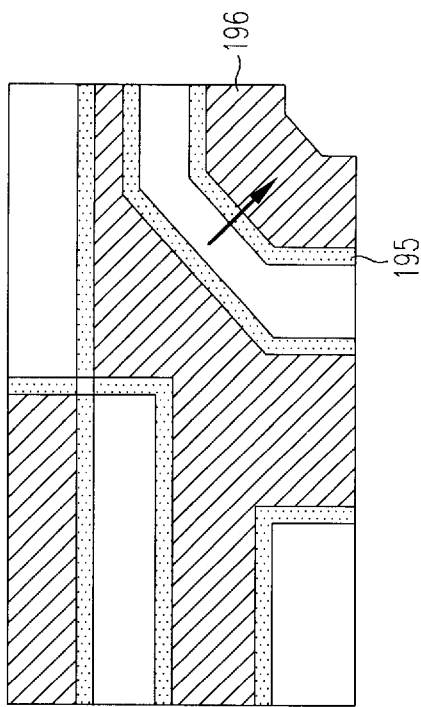
Figure 5C:
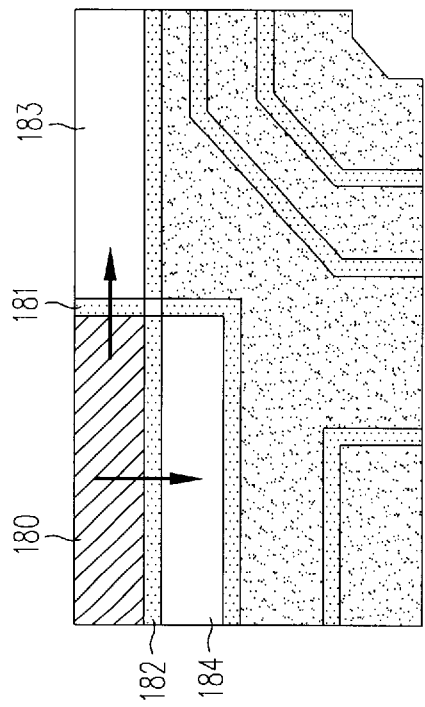
Figure 5D:
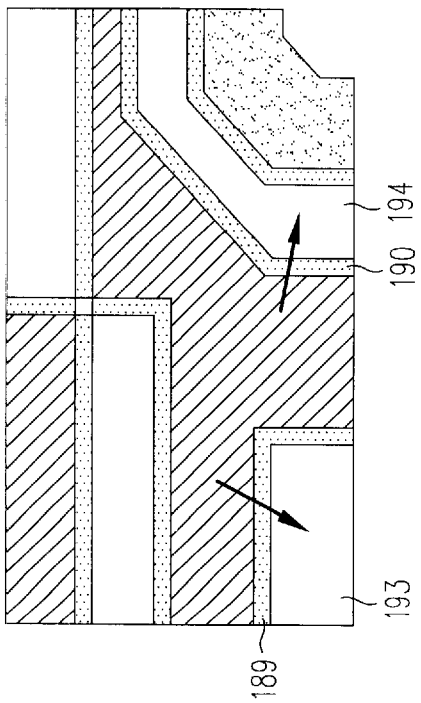

Returning to FIG. 4, in stage 135, the target features in the touch_gates layer are removed from the pool of unused target features. In stage 140, the shifter polygons in the cumulate layer are added to output phase0 layer 191. Shifter polygons 183 and 184 of FIG. 5A, the only polygons in the cumulate layer, are added to layer phase0. In stage 145, the shifter polygons in the start_here layer are added to output phase1 layer 192. Shifter polygon 180 of FIG. 5A, the only polygon in the touch_gates layer, is added to layer phase1. In stage 150, any target features in the pool of unused target features that touch the polygons in the cumulate layer are added to a next_gates layer. Target features 185 and 187 of FIG. 5B are identified as the target features touching shifter polygons 183 and 184 (FIG. 5A), the polygons in the cumulate layer. Target features 185 and 187 are then added to the next_gates layer. In stage 155, any polygons in the pool of unassigned shifter polygons that touch the target features in the next_gates layer are added to the start_here layer. Polygon 188 of FIG. 5B is identified as the only polygon in the pool of unassigned polygons touching target features 185 and 187 (FIG. 5B). Polygon 188 is then added to the start_here layer.

The process then returns to stage 115 in FIG. 4. Stage 120 of FIG. 4 adds target features 189 and 190 (FIG. 5C) to the touch_gates layer. Stage 130 adds shifter polygons 193 and 194 (FIG. 5C) to the cumulate layer. Stage 140 adds polygons 193 and 194 (FIG. 5C) to the phase0 layer. Stage 145 (FIG. 4) adds polygon 188 (FIG. 5B) to the phase1 layer. Stage 150 (FIG. 4) adds target feature 195 (FIG. 5D) to the next_gates layer. Stage 155 (FIG. 4) adds polygon 196 (FIG. 5D) to the start_here layer. The process again returns to stage 115. Since there are no target features in the pool of unused target features adjacent to polygon 196, stages 120, 130, 135, and 140 (FIG. 4) are skipped. In stage 145 (FIG. 4), polygon 196 is added to the phase1 layer. In this embodiment, the output layers, layers 191 and 192, represent actual mask layers. Layers such as start_here, cumulate, touch_gates, and next_gates are derived layers, that is, layers that are created by the computer program performing the shifter polygon phase assignment. The derived layers are created to facilitate manipulating the circuit design data to create the actual mask layers.

Figure 9A:
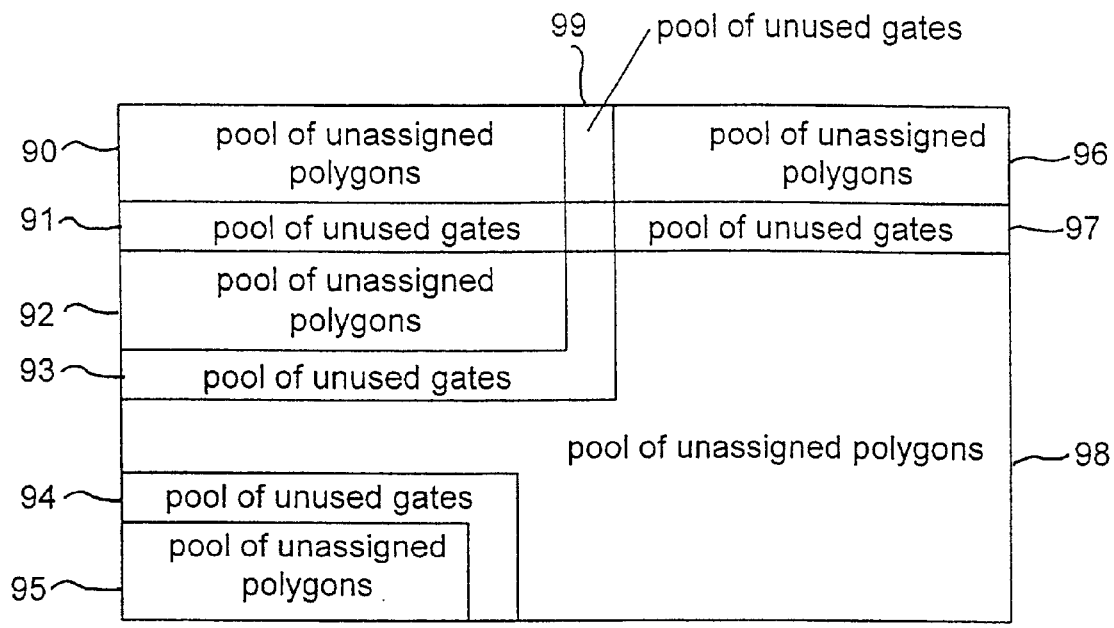
FIGS. 9A–9H show a mask design with the phase assigned to the shifter polygons in accordance with the method of FIG. 4.
Figure 9B:
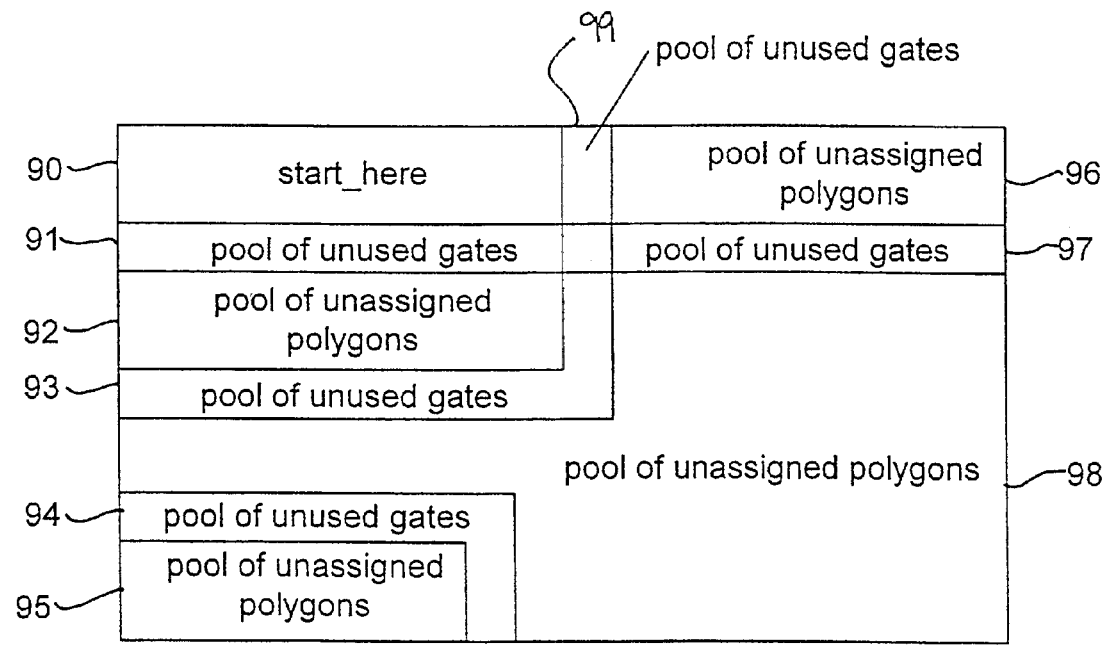
Figure 9C:
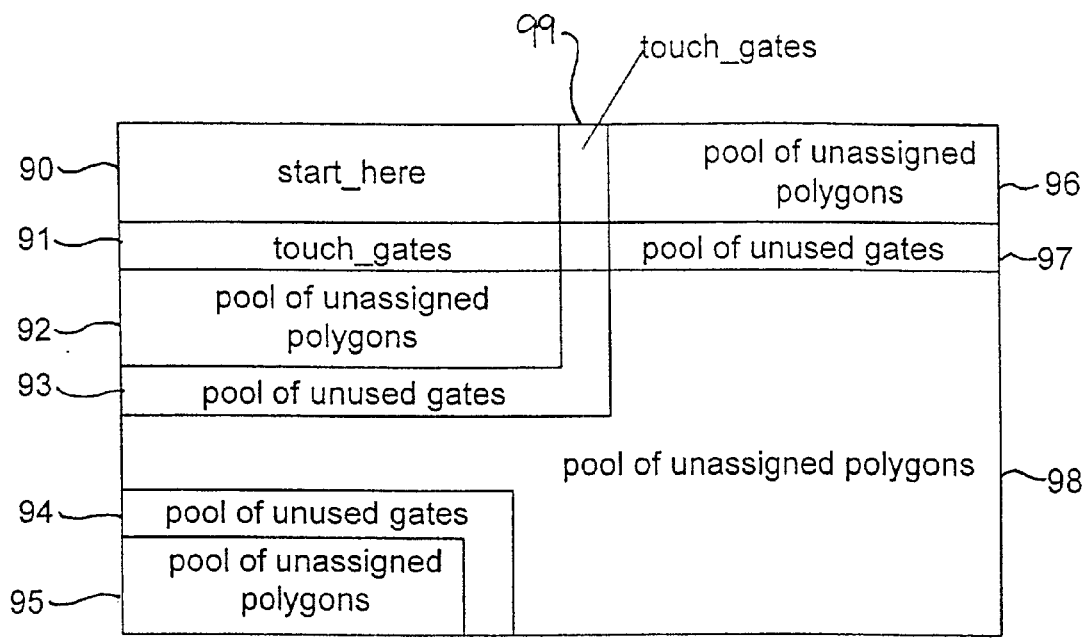
Figure 9D:
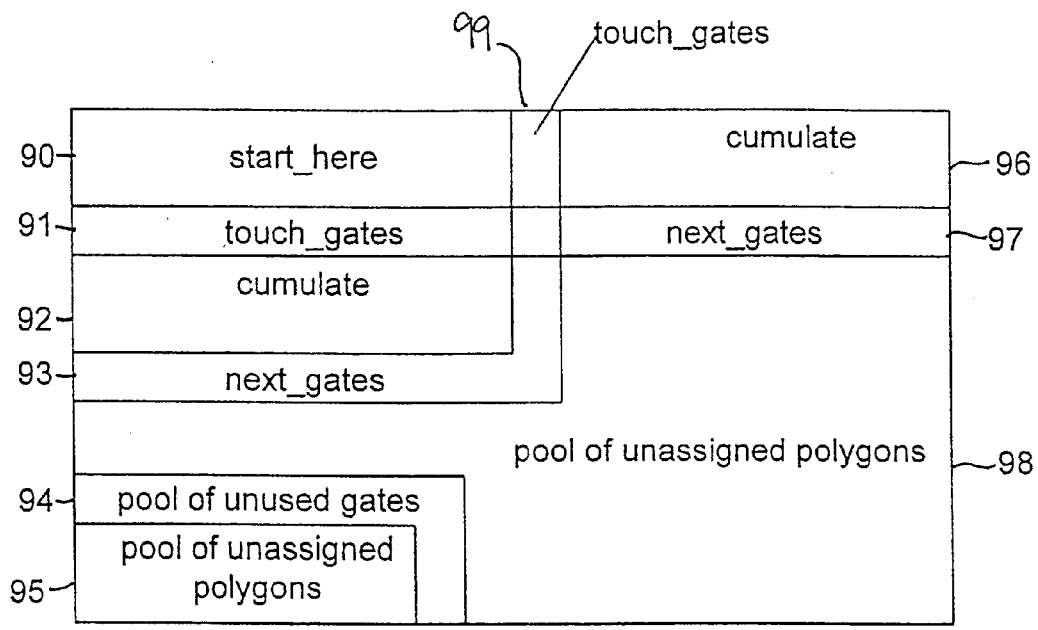
Figure 9E:
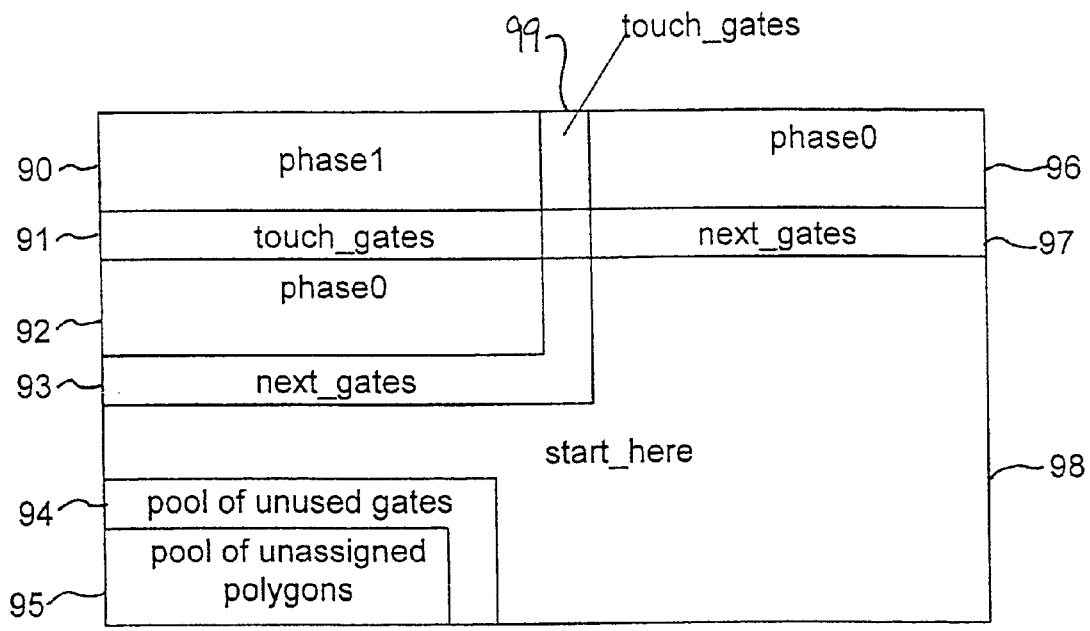
Figure 9F:
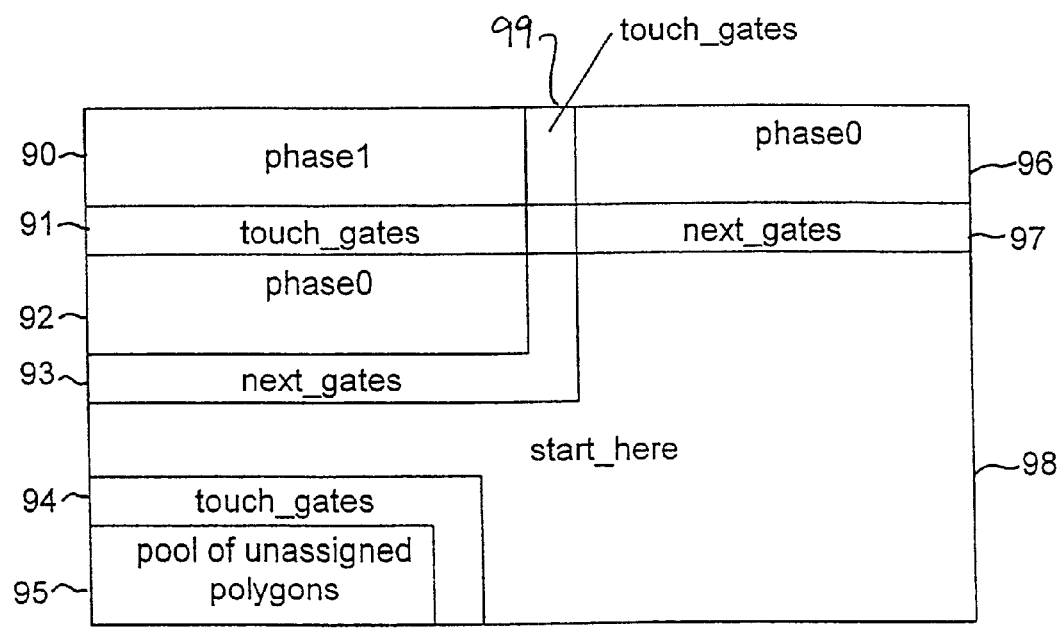
Figure 9G:
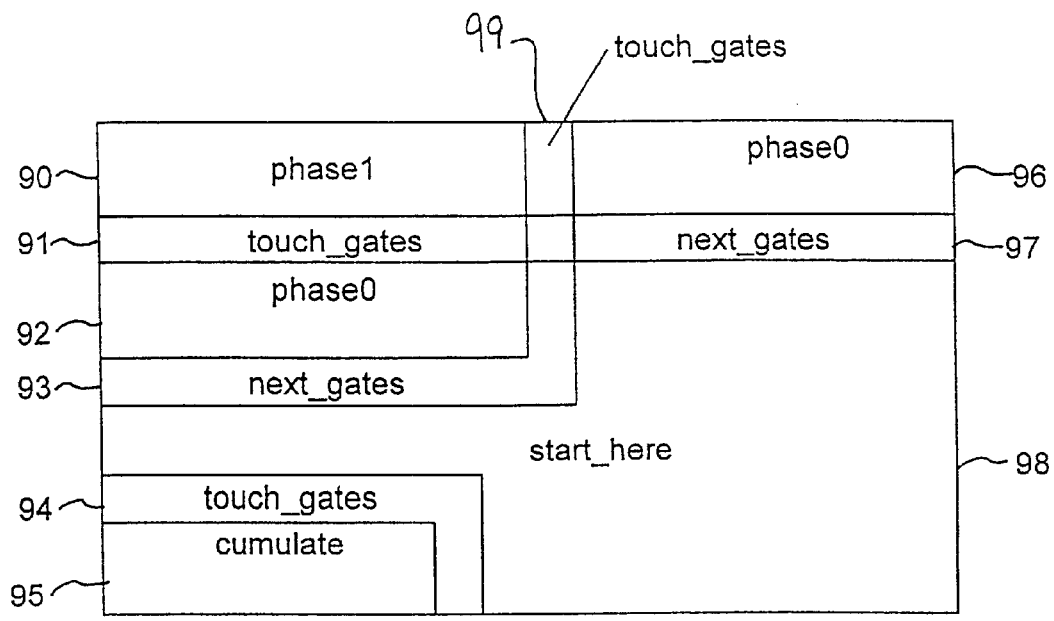
Figure 9H:
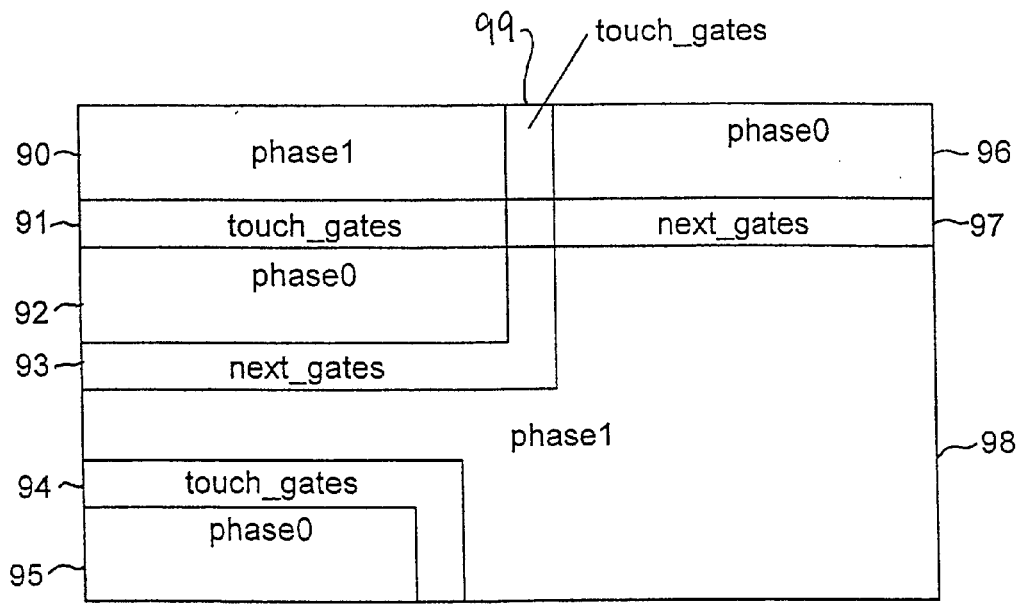

FIGS. 9A–9H further illustrate the method of FIG. 4. In FIG. 9A, a circuit design includes shifter polygons 90, 92, 95, 96, and 98 and target features 91, 93, 94, 97, and 99. Initially, all the shifter polygons are assigned to the pool of unassigned polygons and all the target features are assigned to the pool of unused target features or gates. In stage 110 of FIG. 4, a starter polygon, polygon 90 is selected and added to the start_here layer, shown in FIG. 9B. In stage 120 of FIG. 4, the target features touching polygon 90, target features 91 and 99, are added to the touch_gates layer, shown in FIG. 9C. In stage 130 of FIG. 4, the polygons between the target features in touch_gates and the target features in next_gates, polygons 92 and 96, are added to the cumulate layer, shown in FIG. 9D. In stage 140, the polygons in the cumulate layer are assigned to the phase0 layer, and in stage 145 the polygons in the start_here layer are added to the phase1 layer, shown in FIG. 9E. In stage 150 of FIG. 4, the target features in the pool of unused target features touching the shifter polygons in the cumulate layer, target features 93 and 97 in FIG. 9F, are added to the next_gates layer. In stage 155, the polygons from the pool of unassigned polygons touching the target features in the next_gates are added to the start_here layer, polygon 98 in FIG. 9F. The process then returns to stage 120. The target features next to polygon 98 are added to the touch_gates layer. Thus, target feature 94 of FIG. 9G is added to the touch_gates layer. In stage 130, polygon 95 is added to the cumulate layer. Then, in stages 140 and 145 of FIG. 4, polygon 98 is added to the phase1 output layer and polygon 95 is added to the phase0 layer, shown in FIG. 9H.

Figure 7:
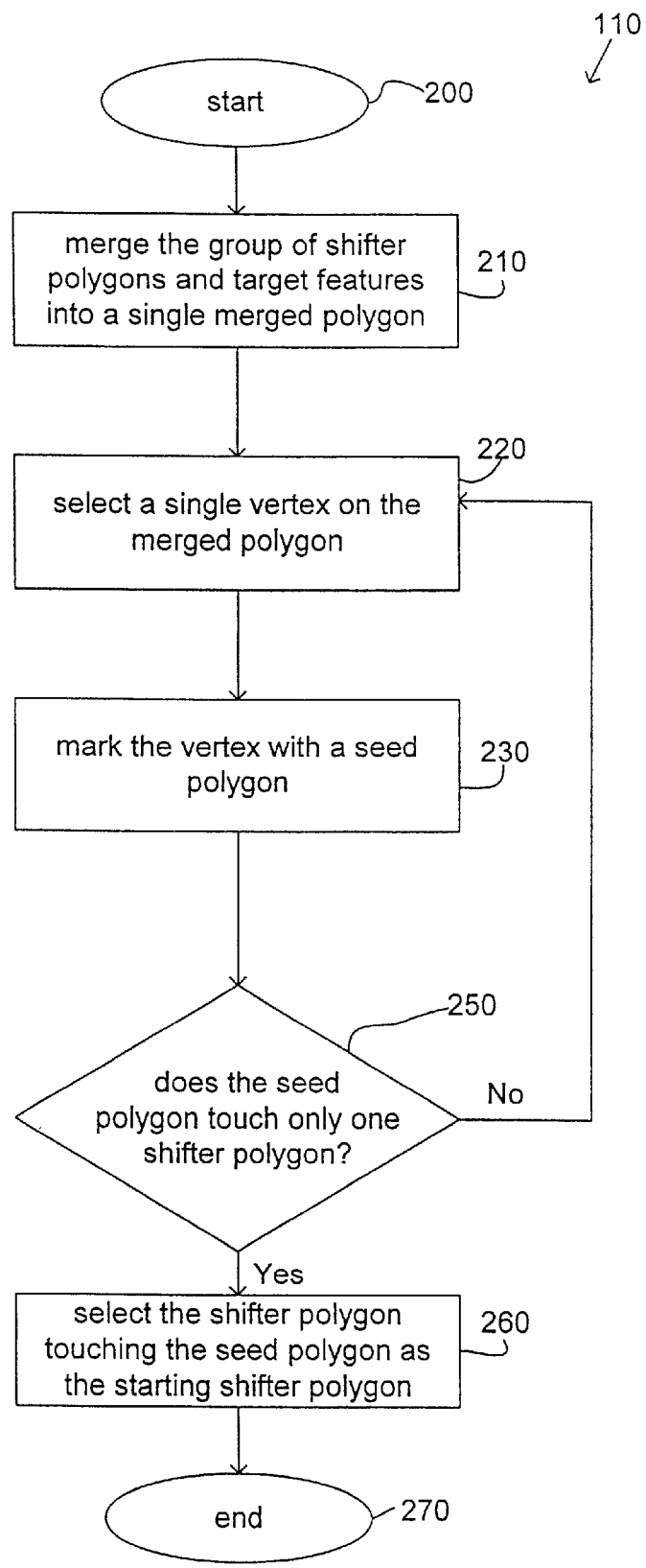
FIG. 7 shows, in a flowchart, one embodiment of a method of selecting a starting polygon.
Figure 8A:
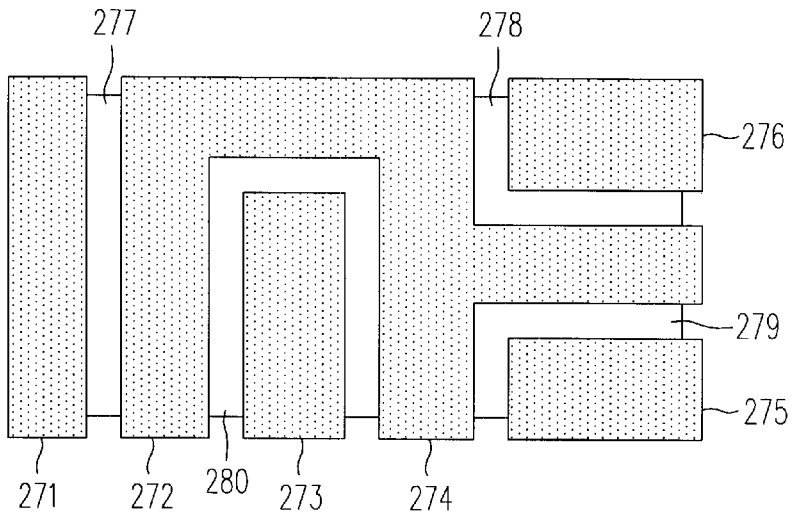
FIGS. 8A–8C shows the selection of a starting polygon in a mask design in accordance with the method of FIG. 7.
Figure 8B:
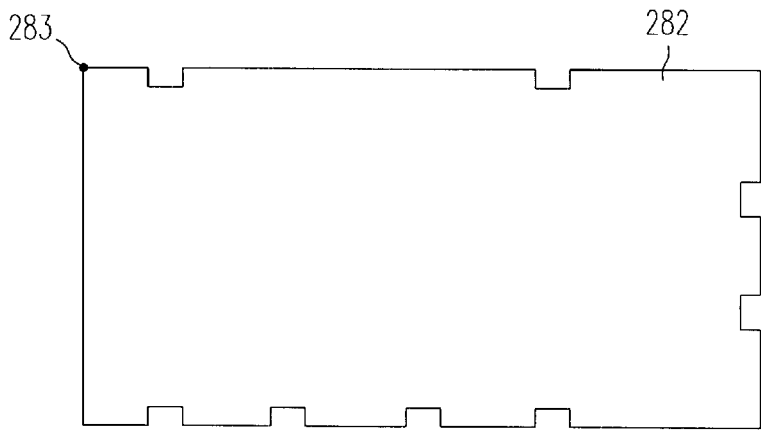
Figure 8C:
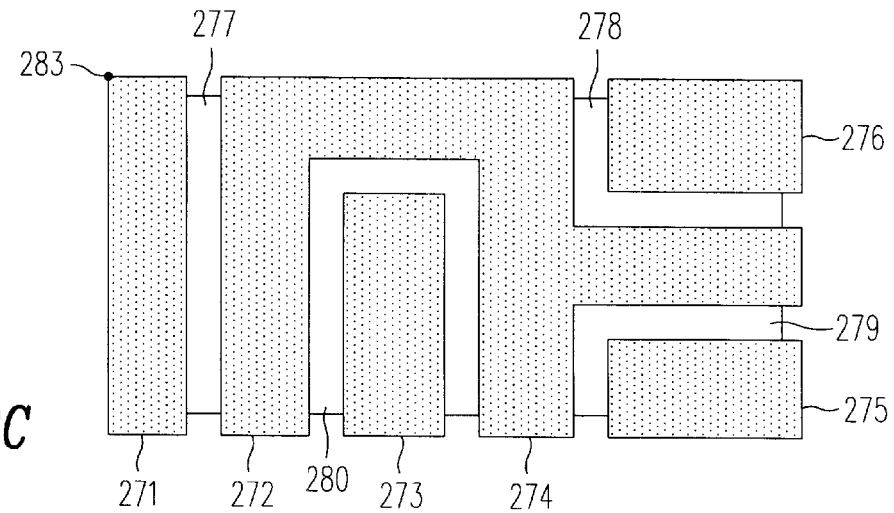

FIG. 7 shows selecting a starting polygon in stage 110 of FIG. 4 in more detail. FIGS. 8A–8D show the selection of a starting polygon in accordance with the method of FIG. 7. In stage 210 (FIG. 7), a group of target features and shifter polygons connected by those target features are merged into a single polygon. Shifter polygons 271–276 and target features 277–280 of FIG. 8A are merged into a single polygon 282, shown in FIG. 8B. In stage 220 and 230, a vertex of the merged polygon is selected and marked with a seed polygon. The top left vertex of merged polygon 282 of FIG. 8B is marked with a seed polygon 283. In stage 250, the seed polygon is checked to make sure it touches only one shifter polygon. Seed polygon 283 of FIG. 8C is checked to make sure it only touches one shifter polygon. If the seed polygon is touching more than one shifter polygon, the process returns to stage 220 and selects a new vertex of the merged polygon. If the seed polygon is only touching one shifter polygon, that shifter is selected as the starting shifter polygon. Since seed polygon 283 touches only polygon 271 in FIG. 8C, polygon 271 is selected as the starting shifter polygon in stage 260 (FIG. 7). The process ends in stage 270.

In one embodiment, the decomposition and phase-assigning operations described above are incorporated into a macro executed by Avant!'s Hercules DRC tool. A user calls the macro, designated Alter2, and provides thereto the following arguments:

1. A layer containing the target features.
2. A layer containing both the target features and the shifter polygons surrounding the target features. The shifter polygons are generated by the macro by subtracting the first layer containing the target features from this layer in a Boolean NOT operation.
3. A layer containing all the pattern polygons from which the target features are derived.
4. A numeric parameter describing the width of the widest target feature that is considered critical.
5. An empty layer used to initialize new layers.
6. A layer containing all of the polygons in the pattern.
7. Two empty layers for accumulating the polygons after they have been assigned one of two phases.
8. An empty layer for accumulating any polygons that are left over after traversing all the target features.
9. A string parameter that is set to "yes" or "no" which determines whether decomposition is performed on the data before phases are assigned to the shifter polygons.

The macro then automatically decomposes the data to prepare it for phase mapping (if specified by the user) and assigns phases to the shifter polygons surrounding target features. Alter2 is a collection of standard Hercules commands assembled to perform the described function. Thus, Alter2 can be executed by any standard computer running Hercules software. The Hercules runset for Alter2 is provided in Appendix A in the syntax of the Hercules software program. Those skilled in the art will realize that the software can be coded in any programming language, and is therefore not limited to the Hercules implementation in Appendix A.

Figure 10A:
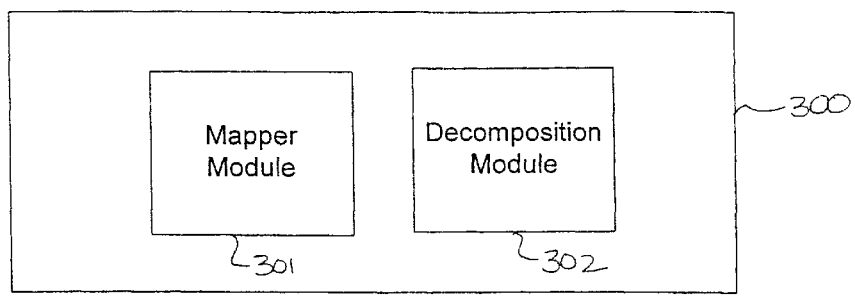
FIGS. 10A–10D show one embodiment of a computer program for forming a phase-shift mask from a set of target features and a set of shifter polygons.

FIGS. 10A–10D show one embodiment of a computer program for forming a phase shift mask. FIG. 10A illustrates the computer program 300. The computer program (one version of which is shown in Appendix A) includes a decomposition module 302 for decomposing the target feature data, and a mapper module 301 for assigning phase to the shifter polygons after the target feature data has been decomposed.

Figure 10B:
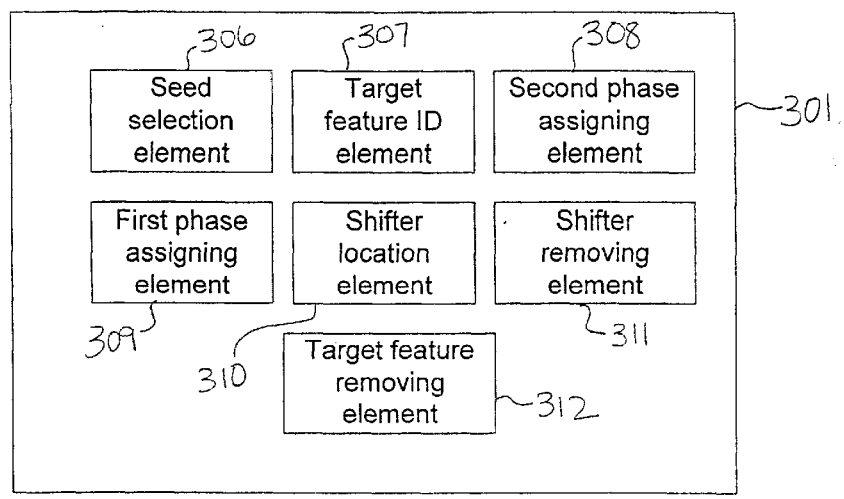

FIG. 10B shows mapper module 301 in more detail. Mapper module 301 includes a seed selection element 306 for selecting the starting shifter polygon. Target feature identification element 307 identifies the target features adjacent to the current layer of shifter polygons. First phase assigning element 309 assigns shifter polygons to the first phase output layer. Second phase assigning element 308 assigns shifter polygons to the second phase output layer. Shifter locating element 310 identifies shifter polygons adjacent to the target features in the current layer of target features. Shifter polygon removing element 311 removes shifter polygons from various layers, for example shifter polygon removing element 311 is used to remove shifter polygons in the current layer of shifter polygons from the pool of unassigned shifter polygons. Target feature removing element 312 removes target features from various layers, for example from the pool of unused target features.

Figure 10C:
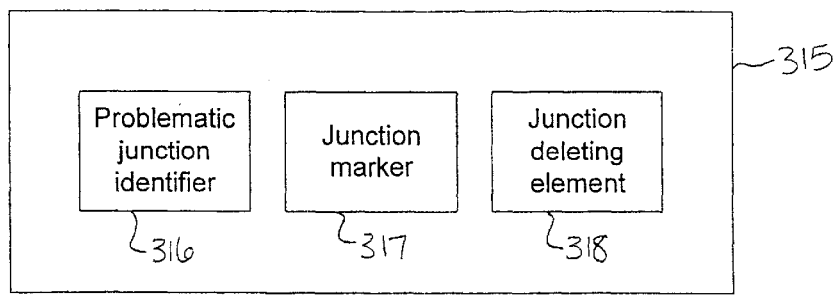
Figure 10D:
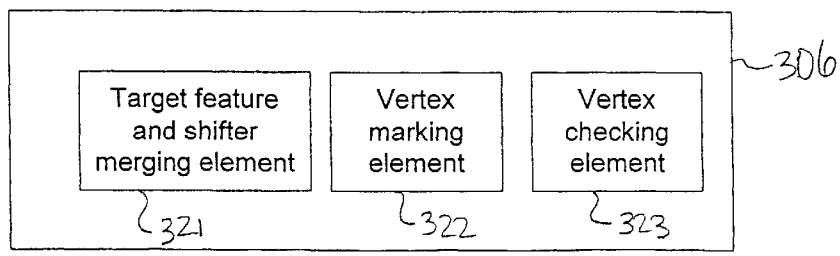

FIG. 10D illustrates seed selection element 306 of mapper module 301 in more detail. Target feature and shifter polygon merging element 321 merges the target feature layer and the shifter polygon layer to form a large shape. Vertex marking element 322 marks a vertex of the merged shape. Vertex checking element 323 checks the marked vertex to make sure it touches only one shifter polygon.

FIG. 10C illustrates decomposition module 302 in more detail. Problematic junction identifier 316 identifies target feature junctions with angles between 225° and 315°. Junction marker 317 marks the junctions identified as possibly problematic. Junction deleting element checks if any markers are closer than the maximum width of a target feature and subtracts the marks and the shape between the marks from the target feature if the markers are closer together than the maximum width of a target feature.

An improved implementation includes a module that converts the connectivity relationships established between the phase-shifting polygons and the target features into a special graph-based data structure. In this graph structure, the "nodes" represent one class of feature (i.e. phase shifters) and the connections between the nodes represents the other class (target features). The color mapping is then performed in the graph structure itself, and the resulting phase assignments are passed back to the corresponding phase shifter polygons. This method provides a significant improvement in mapping speed by eliminating the overhead of the geometric select operations on polygon data, and also provides a data structure that is more amenable to analysis for potential mapping conflicts (i.e. odd cycles).

Various modifications and adaptations of the embodiments and implementations described herein are encompassed by the attached claims. For example, the decomposition and starting shifter selection operations are not limited to the embodiments described herein. Specifically, the decomposition operation can also be performed by using a DRC tool to select only those portions of the target features less than or equal to the maximum width of a target features. The data is thus decomposed because any junctions are not selected. In addition, the data may be decomposed by vectorizing the target features, that is, representing each target feature as only an outline of the target feature. A subset of the lines in the outline that are longer than the maximum width of a target feature are then enlarged, without making the lines longer, to form the target features. The data is thus decomposed because the junctions are not included in the target features. Further, the starting shifter polygon can be selected by calling a DRC tool command that electrically connects all the shifter polygons in a network, then calling another DRC tool command that picks one shifter polygon in the connected network at random.

What is claimed is:

1. A computer-implemented method for assigning phases to a plurality P1 of light shifter polygons of a photolithographic mask through which light is to be transmitted to photolithographically pattern an area on a substrate, wherein the mask has a plurality P2 of target features which are less transmissive to the light than the shifter polygons, wherein each of said target features has a portion whose width is less than a predetermined value, and the portion has edges adjacent to the shifter polygons, wherein any two shifter polygons adjacent to respective two edges of any one of said portions and separated by the portion are to be assigned different phases. the method comprising the acts of:

selecting a set SP1 comprising at least one shifter polygon from said plurality P1;

assigning a phase PH1 to the at least one shifter polygon in set SP1;

identifying a set TF1 comprising at least one target feature of said plurality P2 such that each target feature in set TF1 has a portion having an edge adjacent to one of the at least one shifter polygons in set SP1;

determining a set SP2 comprising at least one shifter polygon in the plurality P1 such that for each shifter polygon L1 in set SP2, at least one of the following conditions C1 and C2 holds:

C1. shifter polygon L1 touches at least one target feature in set TF1;

C2. shifter polygon L1 is one of a sequence of shifter polygons in the set SP2 such that the first shifter polygon in the sequence satisfies the condition C1 and each subsequent shifter polygon in the sequence touches the preceding shifter polygon in the sequence; and assigning a phase PH2, different from the phase PH1, to each shifter polygon in set SP2.

2. The method of claim 1 further comprising the acts of:

removing the shifter polygons in set SP1 from said plurality P1;

removing the target features in set TF1 from plurality P2;

after said removing the target features and said removing the shifter polygons, identifying a set TF2 of at least one target feature of said plurality P2 such that each target feature in set TF2 has a portion having an edge adjacent to at least one of shifter polygons in set SP2; and adding to set SP1 at least one polygon L2, such that for each polygon L2 added to set SP1, at least one of the following conditions C3 and C4 holds:

C3. shifter polygon L2 touches at least one target feature in set TF2;

C4. shifter polygon L2 is one of a sequence of shifter polygons in the set SP1 such that the first shifter polygon in the sequence satisfies the condition C3 and each subsequent shifter polygon in the sequence touches the preceding shifter polygon in the sequence; and assigning phase PH1 to the at least one shifter polygon in set SP1.

3. The method of claim 1 wherein the shifter polygons assigned phase PH1 correspond to polygons on the area which transmit light of a first phase and wherein the shifter polygons assigned phase PH2 correspond to polygons on the area which transmit light of the first phase plus 180 degrees.

4. The method of claim 1 further comprising the acts of:

marking an edge of a target feature in plurality P2 comprising an angle between 225 degrees and 315.

5. The method of claim 4 further comprising the act of:

deleting a portion of a target feature from plurality P2, the portion comprising a first mark, a second mark, and a portion of the target feature between the first and second marks, wherein the first and second mark are closer together than said predetermined value.

6. The method of claim 1 wherein said selecting a set SP1 further comprises:

merging plurality P1 and plurality P2 into a shape;

marking a vertex of the shape;

checking that the marked vertex touches a single shifter polygon in plurality P1;

adding the shifter polygon touching the vertex to set SP1, provided that the shifter polygon touching the marked vertex is the only shifter polygon touching the marked vertex.

7. The method of claim 1 wherein the identifying is accomplished whether or not the set TF1 includes target features whose said portions are not parallel to each other.

8. A method implemented in a design rule check tool for assigning phases to a plurality P1 of light shifter polygons of a photolithographic mask through which light is to be transmitted to photolithographically patterned an area on a substrate, wherein the mask has a plurality P2 of dark target features which are less transmissive to the light than the light shifter polygons, wherein each of said target features has a portion whose width is less than a predetermined value, and the portion has edges adjacent to the shifter polygons, wherein any two shifter polygons adjacent to respective two edges of any one of said portions and separated by the portion are to be assigned different phases, the method comprising the acts of:

adding plurality P1 to a group of unassigned shifter polygons;

adding plurality P2 to a group of unused target features;

initializing a first output layer for shifter polygons of a first phase;

initializing a second output layer for shifter polygons of a second phase;

initializing a first derived layer for a current set of shifter polygons;

initializing a second derived layer for a current set of target features;

initializing a third derived layer for a next set of shifter polygons;

adding at least one shifter polygon from the group of unassigned shifter polygons to the first derived layer;

adding at least one target feature from the group of unused target features to the second derived layer, wherein the at least one target feature touches a shifter polygon in the first derived layer;

removing the shifter polygon in the first derived layer from the group of unused shifter polygons;

adding at least one shifter polygon from the group of unused shifter polygons to the third derived layer, wherein the at least one shifter polygon added to the third derived layer touches the at least one target feature in the second derived layer;

removing the at least one target feature in the second derived layer from the group of unused target features;

adding the at least one shifter polygon in the first derived layer to the first output layer; and adding the at least one shifter polygon in the third derived layer to the second output layer.

9. A computer program for assigning phases to a plurality P1 of light shifter polygons of a photolithographic mask through which light is to be transmitted to photolithographically pattern an area on a substrate, wherein the mask has a plurality P2 of target features which are less transmissive to the light than the shifter polygons, wherein each of said target features has a portion whose width is less than a predetermined value, and the portion has edges adjacent to the shifter polygons, wherein any two shifter polygons adjacent to respective two edges of any one of said portions and separated by the portion are to be assigned different phases, the computer program comprising:

a mapper module, the mapper module comprising:

a first element which selects a set SP1 comprising at least one shifter polygon from said plurality P1;

a second element coupled to the first element and which assigns a phase PH1 to the at least one shifter polygon in set SP1;

a third element coupled to the second element and which identifies a set TF1 comprising at least one target feature of said plurality P2 such that each target feature in set TF1 has a portion having an edge adjacent to one of the at least one shifter polygon in set SP1;

a fourth element coupled to the third element and which determines a set SP2 comprising at least one shifter polygon in the plurality P1 such that for each shifter polygon L1 in set SP2, at least one of the following conditions C1 and C2 holds:

C1. shifter polygon L1 touches at least one target feature in set TF1;

C2. shifter polygon L1 is one of a sequence of shifter polygons in the set SP2 such that the first shifter polygon in the sequence satisfies the condition C1 and each subsequent shifter polygon in the sequence touches the preceding shifter polygon in the sequence; and a fifth element coupled to the fourth element and which assigns a phase PH2, different from the phase PH1, to each shifter polygon in set Sp2.

10. The computer program of claim 9, the mapper module further comprising:

a sixth element coupled to the fifth element and which removes the shifter polygons in set SP1 from said plurality P1;

a seventh element coupled to the sixth element and which removes the target features in set TF1 from plurality P2;

an eighth element coupled to the seventh element and which identifies a set TF2 of at least one target feature of said plurality P2 such that each target feature in set TF2 has a portion having an edge adjacent to at least one of shifter polygons in set SP2; and a ninth element coupled to the eighth element and which ad set SP1 at least one polygon L2, such that for each polygon L2 added to set SP1, at least one of the following conditions C3 and C4 holds:

C3. shifter polygon L2 touches at least one target feature in set TF2;

C4. shifter polygon L2 is one of a sequence of shifter polygons in the set SP1 such that the first shifter polygon in the sequence satisfies the condition C3 and each subsequent shifter polygon in the sequence touches the preceding shifter polygon in the sequence; and a tenth element coupled to the ninth element and which assigns phase PH1 to the at least one shifter polygon in set SP1.

11. The computer program of claim 9 wherein the shifter polygons assigned phase PH1 correspond to polygons on the area which transmit light of a first phase and wherein the shifter polygons assigned phase PH2 correspond to polygons on the area which transmit light of the first phase plus 180 degrees.

12. The computer program of claim 9 further comprising:

a decomposition module comprising:

a first element which marks an edge of a target feature in plurality P2 comprising an angle between 225 degrees and 315.

13. The computer program of claim 12, the decomposition module further comprising:

a second element coupled to the first element and which deletes a portion of a target feature from plurality P2, the portion comprising a first mark, a second mark, and a portion of the target feature between the first and second marks, wherein the first and second mark are closer together than said predetermined value.

14. The method of claim 9 wherein said first element further comprises:
- a first command which merges plurality P1 and plurality P2 into a shape;
- a second command which marks a vertex of the shape;
- a third command which checks that the marked vertex touches a single shifter polygon in plurality P1;
- a fourth command which adds the shifter polygon touching the vertex to set SP1, provided that the shifter polygon touching the marked vertex is the only shifter polygon touching the marked vertex.

* * * * *